(12) United States Patent
Khan et al.

(10) Patent No.: US 8,415,654 B2
(45) Date of Patent: Apr. 9, 2013

(54) LOW RESISTANCE ULTRAVIOLET LIGHT EMITTING DEVICE AND METHOD OF FABRICATING THE SAME

(75) Inventors: Asif Khan, Irmo, SC (US); Qhalid Fareed, Irmo, SC (US); Vinod Adivarahan, Irmo, SC (US)

(73) Assignee: Nitek, Inc., Irmo, SC (US)

( * ) Notice: Subject to any disclaimer, the term of this patent is extended or adjusted under 35 U.S.C. 154(b) by 0 days.

(21) Appl. No.: 12/934,650

(22) PCT Filed: Mar. 27, 2009

(86) PCT No.: PCT/US2009/038628
§ 371 (c)(1),
(2), (4) Date: Sep. 26, 2010

(87) PCT Pub. No.: WO2009/120998
PCT Pub. Date: Oct. 1, 2009

(65) Prior Publication Data
US 2011/0012089 A1      Jan. 20, 2011

Related U.S. Application Data

(60) Provisional application No. 61/070,977, filed on Mar. 27, 2008, provisional application No. 61/070,976, filed on Mar. 27, 2008.

(51) Int. Cl.
*H01L 29/06* (2006.01)
*H01L 31/00* (2006.01)

(52) U.S. Cl.
USPC ............ 257/13; 438/47; 257/E33.023

(58) Field of Classification Search ......... 257/13, 257/E33.014, E33.023, E33.028, E33.031, 257/E33.033; 438/29, 45, 47
See application file for complete search history.

(56) References Cited

U.S. PATENT DOCUMENTS

| 4,594,173 A | 6/1986 | Hobgood |
| 6,121,634 A * | 9/2000 | Saito et al. ............ 257/86 |
| 6,372,582 B1 | 4/2002 | Rouse |

(Continued)

OTHER PUBLICATIONS

Lee, Young Bae, Patent Cooperation Treaty, International Search Report and the Written Opinin of the International Searching Authority or the Declaration, Nov. 12, 2009, in re PCT/US2009/038628, Applicant Nitek, Inc. et al.

(Continued)

*Primary Examiner* — Julio J Maldonado
*Assistant Examiner* — Sonya D McCall Shepard
(74) *Attorney, Agent, or Firm* — Michael A. Mann; Nexsen Pruet, LLC

(57) ABSTRACT

A low resistance light emitting device with an ultraviolet light-emitting structure having a first layer with a first conductivity, a second layer with a second conductivity; and a light emitting quantum well region between the first layer and second layer. A first electrical contact is in electrical connection with the first layer and a second electrical contact is in electrical connection with the second layer. A template serves as a platform for the light-emitting structure. The ultraviolet light-emitting structure has a first layer having a first portion and a second portion of AlXInYGa(1-X-Y)N with an amount of elemental indium, the first portion surface being treated with silicon and indium containing precursor sources, and a second layer. When an electrical potential is applied to the first layer and the second layer the device emits ultraviolet light.

46 Claims, 2 Drawing Sheets

U.S. PATENT DOCUMENTS

| | | | |
|---|---|---|---|
| 6,455,911 | B1 | 9/2002 | Stephani |
| 6,569,765 | B1 | 5/2003 | Solomon et al. |
| 6,664,560 | B2 | 12/2003 | Emerson et al. |
| 7,015,515 | B2 | 3/2006 | Taki |
| 7,163,866 | B2 | 1/2007 | Assaderaghi |
| 7,195,959 | B1 | 3/2007 | Plummer |
| 7,326,963 | B2 | 2/2008 | Gaska et al. |
| 2005/0179045 | A1* | 8/2005 | Ryu et al. .................... 257/94 |
| 2007/0063207 | A1* | 3/2007 | Tanizawa et al. ............. 257/94 |

OTHER PUBLICATIONS

Saxler, A. et al, *Aluminum gallium nitride short period superlattices doped with magnesium*, Applied Physics Letters vol. 74, No. 14, Apr. 5, 1999.

Kozodoy, Peter et al., *Polarization-enhanced Mg doping of AlGaN/GaN superlattices*, Applied Physics Letters vol. 75, No. 16, Oct. 18, 1999.

Wang, T. et al, *1mW AllO GaN-based ultraviolet light-emitting diode with an emissino wavelength of 348 nm grown on sapphire substrate*, Applied Physics Letters vol. 81, No. 14, Sep. 30, 2002.

Zhang, J.P. et al., *Milliwatt power deep ultraviolet light-emitting diodes over sapphire with emission at 278 nm*, Applied Physics Letters vol. 81, No. 26, Dec. 23, 2002.

Chitnis, A. et al., *Improved performance of 325-nm emission AlGaN ultraviolet light-emitting diodes*, Applied Physics Letters vol. 82, No. 16, Apr. 21, 2003.

Zhang, JianPing et al., *AlGaN multi-le-quantum-well-based, deep ultraviolet light-emitting diodes with significantly reduced long-wave emission*, Applied Physics Letters vol. 83, No. 17, Oct. 27, 2003.

Yasan, A. et al., *4.5 mW operation of AlGaN-based 267 nm deep-ultraviolet light-emitting diodes*, Applied Physics Letters vol. 83, No. 23, Dec. 8, 2003.

Fischer, A. J. et al., *Room-temperature direct current operation of 290 nm light-emitting diodes with milliwatt power levels*, Applied Physics Letters vol. 84, No. 17, Apr. 26, 2004.

Adivarahan, V. et al., *High-efficiency 269 nm emission deep ultraviolet light-emitting diodes*, Applied Physics Letters vol. 84, No. 23, Jun. 7, 2004.

Sun, W. H. et al., *AlGaN-based 280 nm light-emitting diodes with continuous wave powers in excess of 1.5mW*, Applied Physics Letters Voll 85, No. 4, Jul. 26, 2004.

Peng, H. et al., *Ultraviolet light-emitting diodes operating in the 340 nm wavelengh range and application to time-resolved fluorescence spectroscopy*, Applied Physics Letters vol. 85, No. 8, Aug. 23, 2004.

Zhang, J.P. et al., *AlGaN-based 280 nm light-emitting diodes with continuous-wave power exceeding 1 mW at 25 mA*, Applied Physics Letters vol. 85, No. 23, Dec. 6, 2004.

\* cited by examiner

LOW RESISTANCE ULTRAVIOLET LIGHT EMITTING DEVICE AND METHOD OF FABRICATING THE SAME

CROSS-REFERENCE TO RELATED APPLICATIONS

The present invention claims priority to pending U.S. Provisional Patent Application No. 61/070,976 filed Mar. 27, 2008, and U.S. Provisional Patent No. 61/070,977 filed Mar. 27, 2008.

BACKGROUND OF THE INVENTION

The present invention relates generally to an ultraviolet light-emitting device and method of manufacturing a light-emitting device.

Group III nitride compound semiconductors such as, for instance, gallium nitride (GaN), aluminum nitride (AlN), indium nitride (InN) (hereinafter also referred to as a "Group III-nitride semiconductor" or "III-nitrides") have been gaining attention as a material for semiconductor devices that emit green, blue or ultraviolet light. A light-emitting diode or a laser diode that emits blue light may be used for displays, for lighting and for high-density optical disk devices. A light-emitting device (which together with the acronym LED, when used herein, will for convenience also refer to both a light-emitting diode and laser diode unless otherwise specified) that emits ultraviolet radiation is expected to find applications in the field of ultraviolet curing, phototherapy, water and air purification, bio-detection, and germicidal treatment. The ultraviolet portion of the electromagnetic spectrum is often subdivided by wavelength into UVA (315-380 nm), UVB (280-315 nm) and UVC (<280 nm).

These LEDs are difficult to manufacture for a number of reasons. For example, defects arise from lattice and thermal mismatch between the group III-Nitride based semiconductor layers and a substrate such as sapphire, silicon carbide, or silicon on which they are constructed. In addition, impurities and tilt boundaries result in the formation of crystalline defects. These defects have been shown to reduce the efficiency and lifetime of LEDs and LDs fabricated from these materials. These defects have been observed for III-Nitride films grown hetero-epitaxially on the above mentioned substrates with typical dislocation densities ranging from $10^8$ $cm^{-2}$ to $10^{10}$ $cm^{-2}$ for films grown via metal-organic chemical vapor deposition (MOCVD), molecular beam epitaxy (MBE), hydride vapor phase epitaxy (HVPE) and several other less common growth techniques. Reducing the dislocation density has accordingly become an important goal.

One way to reduce the dislocation density is based on the use of epitaxial lateral overgrowth (ELOG), which is a well-known technique in the prior art. With this method, the dislocation density can be reduced to about $10^5$ $cm^{-2}$ to $10^7$ $cm^{-2}$. This method, however, has been shown to be ineffective for the growth of aluminum-containing III-Nitride based semiconductors because of the tendency for the aluminum to stick to the masked material and disrupt the lateral overgrowth. Several variations of this approach have also been demonstrated including lateral growth (PENDEO) epitaxy, and facet controlled epitaxial lateral overgrowth (FACELO) growth. All of these techniques suffer from the same limitation as the ELOG approach for aluminum containing III-Nitride materials.

Additionally, a technique called cantilever epitaxy involves growth from pillars that are defined through etching as opposed to, for example, masking.

Currently, several research groups are actively developing low-defect density AlN substrates to improve the power-lifetime performance of the deep UV LEDs. There are reports on a new air-bridge-assisted, high-temperature (1500° C.) lateral epitaxy approach to deposit 12-μm thick, high-quality AlN layers over SiC substrates as templates for the DUV LEDs.

Yet another approach to decreasing defect density is a process referred to as pulsed lateral overgrowth (PLOG) wherein preformed layers are etched to islands. By controlling the flow rate of materials a layer is coalesced over the islands. Pulsed lateral overgrowth of $Al_xGa_{1-x}N$ has previously been demonstrated as an approach for depositing 15-20 μm thick $Al_xGa_{1-x}N$ over basal plane sapphire substrates. Instead of the high temperature approach, a pulsed growth mode at 1150° C. was used to enhance Al-precursor mobilities over the growth surface. These pulsed, laterally overgrown (PLOG), $Al_xGa_{1-x}N$ layers show a significantly reduced number of threading dislocations (~$10^7$ $cm^{-2}$) in the lateral-overgrowth regions, which enabled demonstration of optically-pumped lasing at 214 nm. In previous reports, the PLOG $Al_xGa_{1-x}N$ was grown either from shallow (~0.3 μm) trenched sapphire or from thin AlN etched templates (~0.3 μm).

Several other approaches to dislocation reduction have been reported that do not involve selective area growth including inserting an interlayer between the substrate and the semiconductor layer to relieve strain, filtering dislocations by bending them into each other by controlling surface facet formation or by inserting a Group III-Nitride superlattice layer as described in Applied Physics Letters, Jul. 22, 2002; Volume 81, Issue 4, pp. 604-606, between the buffer layer and the active layer.

Accordingly, several research groups at present are developing III-nitride deep ultraviolet (DUV) light emitting diodes (LEDs) for applications in air and water purification and bio-medical systems. Milli-watt power DUV LEDs on sapphire substrates with AlGaN multiple quantum well (MQW) active regions have been previously reported for the UVA, UVB and the UVC regions. The LED design used in the prior art comprises an AlN buffer layer deposited using pulsed atomic layer epitaxy (PALE), an $AlN/Al_xGa_{1-x}N$, super-lattice layer between the buffer AlN and the n-contact AlGaN layer for controlling the thin-film stress and mitigating epilayer cracking; and a p-GaN/p-AlGaN hetero-junction contact layer for improved hole injection.

A majority of the current solutions for defect mitigation involve a superlattice. The superlattice is ultimately either a sacrificial layer or it is incorporated into the finished LED with relieving the strain or having minimal effect on final device performance. A sacrificial superlattice represents material which must be manufactured and scrapped thereby increasing manufacturing and material cost. It is a challenge to incorporate high n type or p type doping in such high aluminum (Al>30%) content superlattice structures. This lack of doping makes it difficult to fabricate large area lamps in vertically conducting geometry. This insulating superlattice is detrimental to device performance owing to additional device joule heating because of added resistance. The thickness deviation of AlN and AlGaN in superlattice leads to eventual cracking of the superlattice layer due to strain and lattice mismatch. Controlling the thickness of individual layers, quality of the epilayers and composition of AlGaN in a superlattice layer is a major issue in growing high quality crack free thick UVLEDs with superlattices In addition to the difficulties associated with the manufacture of LEDs, currently existing LEDs, including DUV LEDs, experience high series resistance. This high series resistance causes severe device heating, which then results in premature device failure. Device series resistance in laterally conducting DUV LEDs is predominantly caused by the low conductivity (higher resistive) bottom n-type AlInGaN epilayers. It is both well-documented and understood that as the aluminum percentage increases, the doping efficiency decreases. This effect results from the fact that carbon or oxygen, which acts as an unintentional donor atoms in GaN, becomes the deep DX center and thus silicon atoms are compensated because of wide band gap and defects.

One approach to avoiding the high series resistance in a DUV LED includes providing an LED device having a different size and shape such as a novel micro-pixel based DUV LED, as invented by the present inventors and described in PCT Application No. PCT/US2008/073030, filed Aug. 13, 2008, which is incorporated herein by reference in its entirety.

Another approach to avoiding high series resistance is to provide an LED having lower resistive epilayers than what is currently available. When combined with the improved micro-pixel based DUV LED as previously described, the resulting LED device can yield improved device performance, as well as deliver output powers reasonable for system integration.

There has been an overwhelming desire for a DUV LED device and method of for making the same which avoids problems associated with high series resistance.

SUMMARY OF THE INVENTION

The present invention is an ultra-violet light-emitting device and method for fabricating an ultraviolet light emitting device. In a preferred embodiment, the present invention is a deep ultra-violet light-emitting structure ($\lambda_{peak}$=190–369 nm) with an $Al_xIn_yGa_{1-x-y}N$, wherein $0<x\leq1$, $0\leq y\leq1$, and $0<x+y\leq1$, quantum-well active region on a template. The template may include a substrate but has at least a first and a second buffer layer. The first buffer layer is $Al_xGa_{1-x}N$ ($0.0\leq x\leq1$) with a trace amount of elemental indium that is incorporated by either pulsing or flow modulation or interrupted growth mode. The second buffer layer is a nested super-lattice structure comprising AlGaN/(AlGaN/AlGaN) with a trace amount of elemental indium. The ultraviolet light-emitting structure deposited on top of the buffer layers comprises a layered arrangement of an undoped or n-type $Al_xIn_yGa_{1-x-y}N$ (wherein $0<x\leq1$ and $0\leq y\leq0.20$, and $0<x+y\leq1$) low defect density layer(s) that is treated with silicon containing precursors such as silane, disilane etc. that includes a trace amount of elemental indium, a quantum well active region with a trace amount of elemental indium, and p-type $Al_xIn_yGa_{1-x-y}N$ (wherein $0\leq x\leq1$, $0\leq y\leq1$ and $0\leq x+y\leq1$) and GaN materials with a trace amount of elemental indium.

In one embodiment, the present method includes the steps of depositing an AlN buffer layer with a trace amount of elemental indium on a substrate and applying an AlN/AlInGaN second buffer layer with a trace amount of elemental indium to the first buffer layer to form a template. In another embodiment, the first AlN buffer layer may or may not include a trace amount of elemental indium. Additionally, in one embodiment, one buffer layer is micro-undulated layer and the second buffer layer forms a planar layer over the first. Next, a deep ultraviolet light emitting structure (190 nm to 369 nm) is applied onto the template.

The application of the DUV light emitting structure includes the steps of depositing a silicon containing precursor treated or an indium-silicon containing precursor treated low defect density $Al_xIn_yGa_{1-x-y}N$ epilayer doped with silicon or may be co-doped with silicon and indium over the template. Following the growth of the SPSL layer, an n-type layer of $Al_xIn_yGa_{1-x-y}N$ is grown to a thickness of about 0.1 μm to about 7 μm. This layer is subjected to silicon and indium containing precursor source treatment, which causes the formation of holes within the layer or may cause any type of surface roughening or re-structuring. This re-structured surface which may include holes are then filled by subsequent lateral growth of AlGaN. The layer is doped with silicon or silicon with a trace amount of elemental indium.

Following the growth of a silicon containing precursor treated or an indium-silicon containing precursor treated low defect density $Al_xIn_yGa_{1-x-y}N$ epilayer with a trace amount of elemental indium is grown, the present method includes the steps of depositing a quantum well (MQW) active region of doped or undoped $Al_xIn_yGa_{1-x-y}N/Al_xIn_yGa_{1-x-y}N$ with a trace amount of elemental indium. Next, a magnesium-doped, p-type hole tunneling layer of $Al_xIn_yGa_{1-x-y}N$ with trace amount of elemental indium is formed over the MQW layer. P-type grading and contact layers of $Al_xIn_yGa_{1-x-y}N$ and GaN materials, respectively, with magnesium dopant and trace amounts of indium are deposited on the top of the structure.

Additional features, and their advantages as would be realized, are provided in a light-emitting device. The light emitting device has an ultraviolet light-emitting structure with a first layer with a first conductivity, a second layer with a second conductivity; and a light emitting quantum well region between the first layer and second layer. A first electrical contact is in electrical connection with the first layer and a second electrical contact is in electrical connection with the second layer. A template serves as a platform for the light-emitting structure. In one embodiment, the template has a micro-undulated buffer layer with $Al_xIn_yGa_{1-x-y}N$, wherein $0<x\leq1$, $0\leq y\leq1$ and $0<x+y\leq1$, and a second buffer layer over the micro-undulated buffer layer. The second buffer layer is made of $Al_xIn_yGa_{1-x-y}N$, wherein $0<x\leq1$, $0\leq y\leq1$, $0<x+y\leq1$. When an electrical potential is applied to the first electrical contact and the second electrical contact the device emits ultraviolet light. In another embodiment, the template has a superlattice buffer layer and the superlattice may be short period superlattice or a nested superlattice or an alternating layer of group III-nitride material.

Yet another advantage is provided in a light-emitting device. The light-emitting device has an ultraviolet light-emitting structure on a template. The light-emitting structure has a first layer with a first conductivity, a second layer with a second conductivity and a light emitting quantum well region between the first layer and said second layer. In one embodiment, the template has a substrate and a layered arrangement of micro-undulated layers and smooth buffer layers over the substrate. Each micro-undulated buffer layer has $Al_xIn_yGa_{1-x-y}N$, wherein $0<x\leq1$, $0\leq y\leq1$ and $0<x+y\leq1$. The light-emitting device further has a first electrical contact in electrical connection with the first layer and a second electrical contact in electrical connection with the second layer.

Still another advantage is provided in a light-emitted device. In one embodiment, the light-emitting device has a first buffer layer that is AlN with a trace amount of elemental indium and second buffer layer that is an nested superlattice structure. The nested superlattice layer may comprise a continuous gradient with an increasing Ga/Al ratio initiating at zero and terminating at the Ga/Al ratio of the n-contact layer which is selected based on the desired emission of the LED. The indium may or may not be introduced to the first buffer layer. However, elemental indium is preferably introduced to the second buffer layer. Trace amount of elemental indium provides more surface mobility for ad atoms thereby increasing the lateral growth mode and crystallinity to provide for a better surface roughness and film quality. As used herein, "trace amount of elemental indium" refers to an amount of indium that is about $10^{14}$ to about $10^{24}$ atoms of elemental indium per cm$^3$.

Yet another advantage is provided in a light-emitting device. The light-emitting device has an ultraviolet light-emitting structure deposited on top of the buffer layers that includes a layered arrangement of an undoped or n-type $Al_xIn_yGa_{1-x-y}N$ (wherein $0<x\leq1$ and $0\leq y\leq1$, and $0<x+y\leq1$) low defect density layer(s) that is treated with silicon and indium containing precursor sources and that includes a trace amount of elemental indium, a quantum well active region with a trace amount of elemental indium, and p-type $Al_xIn_yGa_{1-x-y}N$ (wherein $0\leq x\leq1$, $0\leq y\leq1$ and $0\leq x+y\leq1$) and GaN materials with a trace amount of elemental indium. In one embodiment, this layer is also doped with silicon. The introduction of a trace amount of elemental indium provides for better surface mobility and migration of various ad atoms. As used herein, "ad atoms" refers to atoms that lay on a crystal surface, and that are the opposite of surface vacancy. The use of indium can increase the lateral growth mode by providing a better surface roughness and film quality such as crystallinity. Moreover, silicon and indium containing precursor source treatment for high Al based AlInGaN provides roughness to the surface through pulse cycle etching. Incorporation of indium also assists in the pacification of defects and increases silicon doping efficiency.

Yet another advantage is provided in a light-emitting device. The light-emitting device has a quantum well (MQW) active region of doped or undoped $Al_xIn_yGa_{1-x-y}N/Al_xIn_yGa_{1-x-y}N$ with a trace amount of elemental indium. The presence of a trace amount of elemental indium increases the crystallinity of the material and improves the structural quality of the $Al_xIn_yGa_{1-x-y}N$ epilayers. The trace amount of indium in the MQW layer is preferably in the range of about 0.001-5%.

Still another advantage is provided in a light-emitting device. The light-emitting device has an hole tunneling layer with magnesium as a dopant and with a trace amount of elemental indium. When magnesium is used as a dopant in typical p-type AlGaN layers for LEDs, doping is poor because of the compensation of carriers by a large number of native defects. Also, the binding energy of magnesium is higher than that for GaN. Thus, in the present invention indium is included in an amount that is just enough to compensate for the defects. The indium acts as a defect passivant. This trace amount of elemental indium will also help in lowering the binding energy of magnesium which then helps in improving doping conversion and efficiency. It is also possible that indium binds with hydrogen and thereby releases magnesium atoms for effective doping.

Still another advantage is provided in a light-emitting device. The light-emitting device has p-type epilayers of $Al_xIn_yGa_{1-x-y}N$ (wherein $0\leq x\leq1$, $0\leq y\leq1$ and $0\leq x+y\leq1$) and GaN materials with a trace amount of elemental indium. In one embodiment, these epilayers include a grading layer and a contact layer, which include magnesium and indium. By pulsing the Mg and In source separately so that only elemental species are introduced in the structure at one time, on a atomic scale GaN:Mg/GaN:In super-lattice formation may not be detectable.

A particularly preferred embodiment is provided in a method of making a light-emitting device. The method includes the steps of:

forming a template by:

applying a first buffer layer to a substrate, wherein the first buffer layer comprises AlN with a trace amount of elemental indium; and a second buffer layer comprising of $Al_{(1-m-n)}Ga_mIn_nN$ wherein said second buffer layer is doped with silicon and a trace amount of indium wherein $0\leq m\leq\alpha$ and $0\leq n<1$ with 'm' increasing with distance from said substrate, with a trace amount of elemental indium;

placing an ultraviolet light-emitting structure on the template wherein the ultraviolet light-emitting structure has a layer of undoped or n-type $Al_xIn_yGa_{1-x-y}N$ (wherein $0<x\leq1$ and $0\leq y\leq1$, and $0<x+y\leq1$) that is treated with silicon and indium containing precursor sources and that includes a trace amount of elemental indium with a first conductivity, and a second layer of p-type $Al_xIn_yGa_{1-x-y}N$ (wherein $0\leq x\leq1$, $0\leq y\leq1$ and $0\leq x+y\leq1$) with a trace amount of elemental indium with a second conductivity; and connecting electrically a first electrical contact with the first layer of the ultraviolet light-emitting structure and a second electrical contact with the second layer of the ultraviolet light-emitting structure.

Other features and their advantages will be apparent to those skilled in the art of semi-conductor design and light-emitting diodes in particular from a careful reading of the foregoing Detailed Description of Preferred Embodiments, accompanied by the following drawings.

DETAILED DESCRIPTION OF PREFERRED EMBODIMENTS

The present invention is directed to a light-emitting device (LED) and a method for making an LED, particularly one that emits deep ultraviolet light. In particular, it is directed to a template that serves as a platform for an improved ultraviolet light-emitting structure, which includes epilayers constructed to overcome high series resistance.

The invention will be described with reference to the various figures forming an integral part of the instant disclosure. The figures and descriptions thereof, refer specifically to preferred embodiments without limit thereto. Throughout the figures similar elements will be numbered accordingly.

Figure 1:
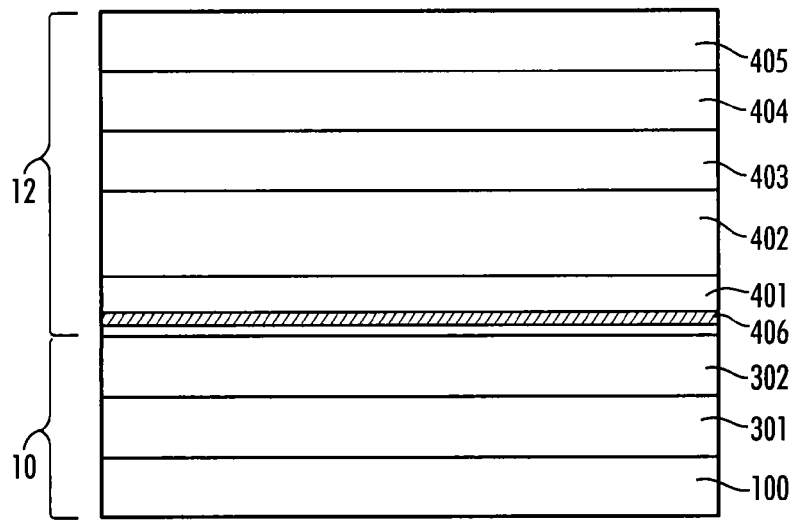
FIG. 1 is a schematic cross-sectional view of an embodiment of the present invention.

An embodiment of the invention will be described with reference to FIG. 1 wherein a schematic cross-sectional view is provided. In FIG. 1, a template, 10, includes a substrate, 100. A first buffer layer, 301, is added onto the substrate. A second buffer, 302, is applied to the first buffer. These buffer layers will be described more fully herein. In one embodiment, the second buffer layer forms a smooth surface upon which subsequent layers are formed. The substrate, 100, first buffer, 301, and second buffer, 302, taken together are referred to herein as a template. In an alternate embodiment the arrangement of the first buffer layer and second buffer layer may be repeated once or multiple times.

An ultraviolet light-emitting structure, 12, is applied to the template, 10. In general, the ultraviolet light-emitting structure comprises multiple semiconductor layers of opposing polarity separated by a quantum well layer. Each layer will be described further herein. The order of the semiconductor layers is not particularly limited with the proviso that eventual biasing is applied correctly. For the purposes of discussion the n-type semiconductor will be described as being deposited initially with the understanding that the reverse could be done in an analogous fashion.

The first semiconductor layer, 401, having a first type of conductivity is applied to the template. This layer is illustrated as including a second layer 406 within the main layer 401, or a layer within a layer. Additionally, the first layer 401 can include a single, but interrupted layer. Preferably, the semiconductor layer 401 includes an undoped or n-type $Al_xIn_yGa_{1-x-y}N$ (wherein $0<x\leq1$ and $0\leq y\leq1$, and $0<x+y\leq1$) layer(s) that is treated with a silicon containing precursor source and that includes a trace amount of elemental indium. The second layer 406 preferably includes an amount of elemental silicon and elemental indium.

Figure 2:
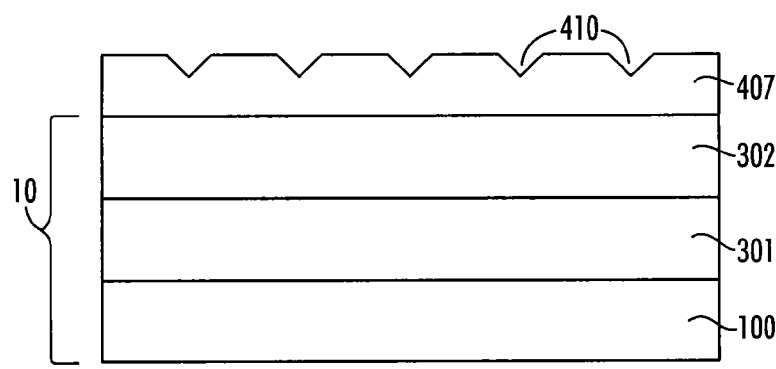
FIG. 2 is a schematic cross-sectional view of an embodiment of the present invention.
Figure 3:
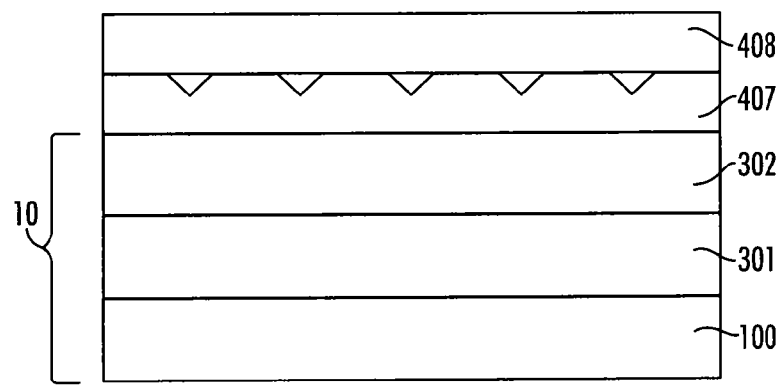
FIG. 3 is a schematic cross-sectional view of an embodiment of the present invention

In one embodiment, shown in FIGS. 2-3, the first semiconductor layer 401 includes a first portion 407 that preferably comprises $Al_xIn_yGa_{(1-X-Y)}N$ grown to thickness 0.1 μm to 7 μm. The first portion is then subjected to treatment with silicon containing precursor source which causes the formation of holes or surface restructuring 410 along the surface of the layer. Depending on the concentration of the silicon precursor sources and time of treatment, the surface holes density and size, structures are controlled. These holes are then filled by ad atoms and then subsequent lateral growth of $Al_xIn_yGa_{(1-X-Y)}N$ with or without a trace of amount of elemental indium to form the second portion 408 of the semiconductor layer. In one embodiment, the first layer includes a plurality of first portion and second portion. The pulsing of indium and silane, Al, and Ga during the AlInGaN template layer growth creates a layer of silicon and indium that is on the order of about 5 Angstroms or less. The presence of indium is key to lateral epitaxy even at low temperature (less than 1000° C.) compared to layers grown at conventional MOCVD growth temperature (greater than 1000° C.). Though illustrated as two layers, the first semiconductor layer may include additional layers wherein each layer has an elemental composition differing, or the same as, one or more adjacent layers. In one embodiment, the first semiconductor layer is also doped with silicon and/or indium. Accordingly, first layer can include multiple and/or alternating layers of doped AlInGaN.

A quantum well, 402, is applied to the first semiconductor layer, 401. The quantum well, though illustrated as a single layer, preferably comprises several layers forming a quantum-well region. It is most preferred that the quantum well have an emission spectrum ranging from 190 nm to 369 nm. The quantum well preferably comprises $Al_xIn_yGa_{1-X-Y}N$ wherein $0\leq x\leq1$, $0\leq y\leq1$, and $0\leq x+y\leq1$ with a trace amount of elemental indium. The quantum well preferably has a surface and a band gap. In one embodiment, a barrier layer is preferably on the surface of the quantum well and more preferably the quantum well region begins and terminates with the barrier layer. The barrier layer is made of $Al_xIn_yGa_{1-X-Y}N$ wherein $0<x\leq1$, $0\leq y\leq1$ and $0<x+y\leq1$ and has a band gap which is larger than the band gap of the quantum well. In one embodiment the quantum layer comprises alternating layers comprising $Al_xIn_yGa_{1-X-Y}N$ wherein $0\leq x\leq1$, $0\leq y\leq1$, and $0\leq x+y\leq1$ with or without a trace amount of elemental indium.

In one embodiment, the quantum well region begins and terminates with the barrier layer. The barrier layer preferably includes $Al_xIn_yGa_{1-X-Y}N$ wherein $0<x\leq1$, $0\leq y\leq1$ and $0<x+y\leq1$ with a trace amount of elemental indium and the quantum well and barrier layer have different compositions. The quantum well region preferably comprises a single quantum well and multiple quantum well layers. In one embodiment the quantum well is preferably doped with at least one n-type dopant with the most preferred intentional dopants selected from the group consisting of silicon, oxygen and indium and un-intentional doped carbon. In another embodiment the quantum well is doped with at least one p-type dopant preferably selected from the group consisting of magnesium, zinc and beryllium. In another embodiment the quantum well is doped with at least one n-type and at least one p-type dopant. It is particularly preferred that the quantum well region produces ultraviolet photons. In a preferred embodiment the quantum well region emits with a wavelength λ in the range 190 nm≤λ≤240 nm. In another preferred embodiment the quantum well region emits with a wavelength λ in the range 240 nm≤λ≤280 nm. In another preferred embodiment the quantum well region emits with a wavelength λ in the range 280 nm≤λ≤320 nm. In another preferred embodiment the quantum well emits with a wavelength λ in the range 320 nm≤λ≤369 nm.

A second semiconductor layer, 403, having a second type of conductivity than the first semiconductor layer is applied on the quantum well. Two metal contacts are ultimately applied to this construction, one to the semiconductor layer having the first type of conductivity and the other to the semiconductor layer having the second type of conductivity, to complete the LED. Each of these layers, and formation of contacts thereto will be described in detail below.

In one embodiment, the first buffer layer is a micro-undulated layer. The micro-undulated layer is defined as a layer with a root mean square surface roughness ($R_{rms}$) of at least 10 Angstroms to no more than 10 μm. More preferably, the micro-undulated layer has a surface roughness of 10 angstrom to 2 μm. The micro-undulated layer thickness is a function of the roughness and is at least slightly larger than the $R_{rms}$ roughness. If the layer thickness is less than the roughness portions of the substrate may be left uncovered which is highly undesirable. If the layer thickness is much higher than the roughness no further benefit is obtained.

The micro-undulated layer may be bound by crystallographic faces with (0001), (1-100), (1011), (1-102), (11-20, (11-22) facets being most preferred.

The micro-undulated layer is deposited by controlling the flow of group III (Ga, Al and In) precursors and Ammonia ($NH_3$). In one embodiment of invention, the micro-undulated layer is deposited at temperature ranging from 400-1000° C.

In another embodiment, the micro-undulated layer is deposited at a high V/III ratio ranging from 1000 to 500,000. A group V precursor such as $NH_3$ or Nitrogen is modulated by decreasing and increasing the flux.

The micro-undulated layer preferably has a growth rate of about 60 Å to about 100 μm per hour with at least 0.2 μm per hour being most preferred.

The micro-undulated layer is preferably an AlGaN layer with ammonia flux flown constantly while the Group III precursor (Al and Ga in this case) is modulated by increasing or decreasing the sources flowing into chamber. The time taken to increase or decrease the flux ranges from at least 1 sec to about 120 secs and the flow is preferably stabilized at the increased or decreased flow conditions for at least 1 sec to about 120 secs.

The group III precursor is preferably flown constantly while the group V precursors such as $NH_3$ or nitrogen is modulated from 50 standard cubic centimeters per minute (sccm) to 10,000 sccm. The time taken to increase or decrease the group V flux ranges from at least 1 sec to about 120 secs and is stabilized at the increased or decreased flow conditions for at least 1 sec to 120 secs.

In another way of depositing micro-undulated layer, the group III and group V precursor is flown constantly while the temperature is modulated from 400 to 1000° C. The conditions are created such that the micro-undulated surface formed.

In one embodiment, the second buffer layer is a smooth layer characterized by a root mean square surface roughness ($R_{rms}$) of less than 30 Angstroms and more preferably less than 10 Angstroms. A roughness of about 2-3 Angstroms has been successfully demonstrated. The second buffer layer thickness is a function of the roughness of the underlying micro-undulated layer with a thickness sufficiently thick to form a continuous layer being necessary. If the layer thickness of the second buffer layer is to small an adequate smoothness can not be obtained. If the layer thickness is too large no further benefit is obtained.

The second buffer layer is formed over the micro-undulated layer. The second buffer layer is deposited by controlling the flow of group III (Ga, Al and In) precursors and Ammonia ($NH_3$). In one embodiment of invention, the second buffer layer is deposited at temperature ranging from 800-1300° C.

The second buffer layer is also defined as a layer having at least one surface preferably selected from (001), (110), (101), (102) or (114) facets.

The second buffer layer is deposited at a variable V/III ratio ranging from 0 to 100000. A group V precursor such as $NH_3$ or Nitrogen is modulated by decreasing and increasing the flux.

The second buffer layer preferably has a growth rate of at least 0.01 µm hour and root mean square roughness ranging from 1 Å to 100 Å.

The second buffer layer is preferably an AlGaN layer with ammonia flux flown constantly while the Group III precursor (Al and Ga in this case) is modulated by increasing or decreasing the sources flowing into chamber. The time taken to increase or decrease the flux range from at least 1 sec to 60 secs and stabilize at the increased or decreased flow conditions for same flow for at least 1 sec to 120 mins.

The group III precursor can be flown constantly while the group V precursor, such as $NH_3$ or Nitrogen, is modulated from 0 sccm to 50,000 sccm. The time taken to increase or decrease the group V flux range is at least 1 sec to about 120 secs and the flow is preferably stabilized at the increased or decreased flow conditions for at least 1 sec to about 120 secs.

In another way of depositing buffer, the group III and group V precursor is flown constantly while the temperature is modulated from 800 to 1300° C. The conditions are created such that the smooth surface is formed.

While not limited to any theory, it is hypothesized that the second buffer layer coalesces over the micro-undulated layer thereby mitigating dislocation defects in the underlying crystalline lattice.

Surface roughness, as referred to herein, is an arithmetic average of absolute values of vertical deviation of the roughness profile from the mean line which is referred to in the art as $R_a$. Surface roughness is measured in accordance with the ASME Y14.36M-1996 standard.

Each layer, other than the substrate, is made of a Group III-nitride, preferably $Al_xIn_yGa_{1-x-y}N$ (wherein $0<x\leq1$, $0\leq y\leq1$ and $0<x+y\leq1$). The precursor sources include a metal-organic source, ammonia, a carrier gas and, optionally, doping sources such as disilane, silane, and/or biscyclopentadienyl magnesium. The metal-organic source is preferably trimethyl aluminum, triethyl aluminum, trimethyl gallium, triethyl gallium, trimethyl boron, trimethyl iron, triethyl indium or trimethyl indium. The preferred carrier gas is hydrogen and/or nitrogen.

Figure 4:
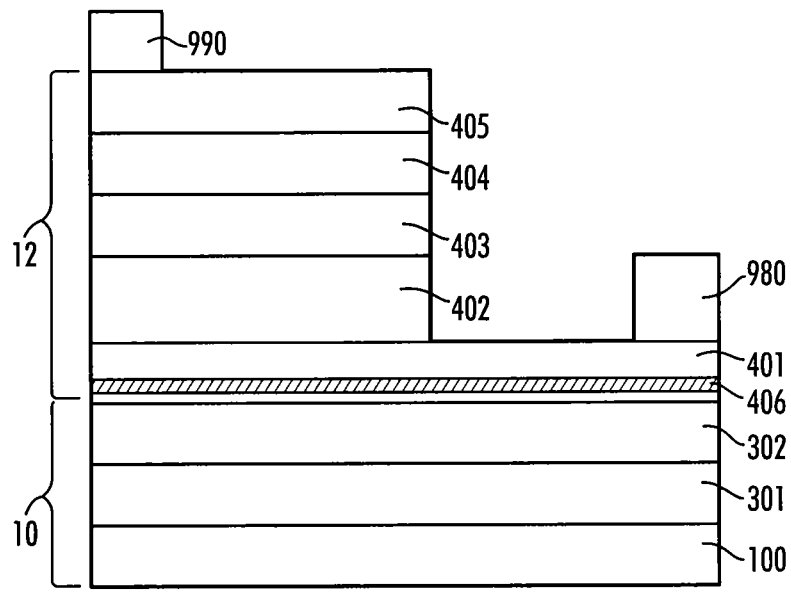
FIG. 4 is a schematic cross-sectional view of an embodiment of the present invention.

FIG. 4 illustrates template 10 with a layered, UV-emitting structure, 12, thereon, plus metal contacts 980 and 990. Except for metal contacts, 990 and 980, and the substrate, 100, all layers are preferably made of III-Nitride material.

With further reference to FIG. 4, the LED structure is grown beginning with III-Nitride first semiconductor layer, 401, with a first type of conductivity, applied directly on the second buffer, 302. It is preferred that the first semiconductor layer be an n+ layer made of $Al_xIn_{1-x}Ga_{1-x-y}N$ (wherein $0<x\leq1$, $0\leq y\leq1$ and $0<x+y\leq1$) with a trace amount of elemental indium formed such that the layer is transparent to the light to be emitted from the quantum well active region. Another III-Nitride layer, 402, is then formed which includes one or more barrier and one or more well sub-layers, each having different compositions such that the band-gap of the barrier layer is larger than that of the well layer. The thickness of the barrier and well layers should be between 1-200 Å. This well sub-layer has a specific band-gap and is designed to provide a region with good quantum confinement, wherein electrons and holes readily combine, preferably with radiative and non-radiative recombination but with radiative recombination dominating the non-radiative recombination. The quantum well sub-layer emits light in the range of 190 nm to 369 nm. Layer, 401, is given the first type of conductivity using silicon, or is co-doped using a combination of silicon, oxygen, and/or indium.

A p-type AlInGaN hole tunneling layer, 403, with a trace amount of elemental indium is incorporated directly above the active region layer, 402, such that the band-gap of, 403, is larger than the bandgap of the barrier sublayer 402. Magnesium is preferably used as the p-type dopant. Additional p-type AlInGaN layers may be formed on top of, 403, such that the band-gap of the layers decreases for each subsequent layer. These can include grading layer 404 and contact layer 405. Preferably, grading layer comprises $Al_xIn_yGa_{1-x-y}N$ (wherein $0\leq x\leq1$, $0\leq y\leq1$ and $0\leq x+y\leq1$) with a trace amount of elemental indium, and contact layer comprises GaN with a trace amount of elemental indium. Subsequent layers may be one single AlInGaN layer, or may consist of a compositionally graded layer, a series of decreasing composition superlattices, or several distinct layers with decreasing bandgap to afford adequate adherence to the contact, 990.

A mesa-type LED may then be fabricated, the type shown in FIG. 4, using reactive ion etching (RIE) to access the bottom n+ layer. Finally, probe metal conducting pads, 980 and 990, are deposited on both the n+ and p+ layers, respectively. Ti/Al/Ti/Au and Ni/Au are used as metal contacts for the n− and p− contacts, respectively, however, the n-metal contacts can be made of Ti, Al, Ni, Au, Mo, Ta or any combination of these metals. The second contact, the p+ layer contact, can be made of Pd, Ni, Ag, Au, ITO, NiO, PdO or any combination of the above-mentioned metals. These contacts could be annealed in air, a forming gas, nitrogen or any combination of such. As would be apparent the layer arrangement can be reversed without consequence.

Figure 5:
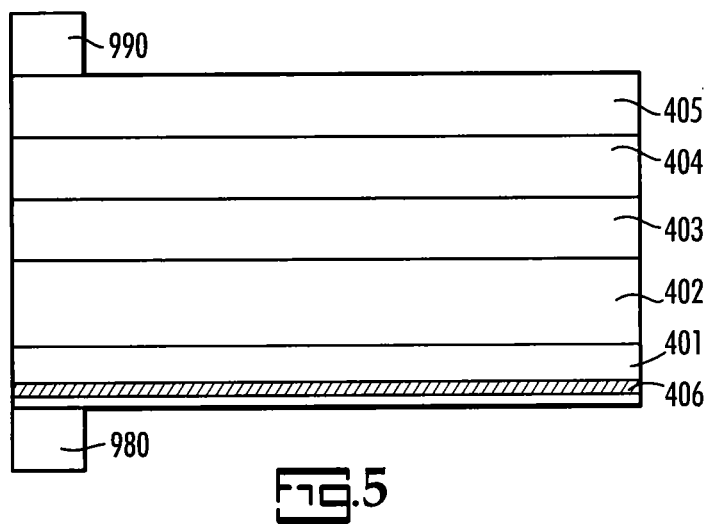
FIG. 5 is a schematic cross-sectional view of an embodiment of the present invention.

In an alternative configuration, shown in FIG. 5, after construction the template may be removed by polishing, etching or lifting-off using a laser. A metallic contact, 980, can be applied to the backside the n-layer, 401. The p-contact, 990, could be attached to layer, 405.

It is an ongoing desire to reduce resistance in a layer, and particularly, at the interface between layers. Resistance at the contact layers is a particular concern since this resistance is a source of heat. As current is increased the heat increases. This limits the current at which an LED can be operated. With silicon doping, this is a particular problem. The incorporation of indium in a layer has been surprisingly found to significantly reduce the resistance of a layer. Indium is particularly desirable in doped layers such as silicon doped or magnesium doped layers. At a given level of silicon doping, for example, incorporation of indium reduces the resistance thereby decreasing the heat generation which allows for an increase in the current at which the LED can be operated. In a silicon doped layer the indium is preferable present in an amount of atoms ranging from $10^{14}/cm^3$-$10^{24}/cm^3$. In a magnesium doped layer the indium is preferably present in an amount of atoms ranging from $10^{15}/cm^3$-$10^{24}/cm^3$.

Although preferably made of sapphire, the substrate may be made of silicon carbide, GaN, AlN, AlGaN, InN, InGaN, AlInGaN, Silicon, GaAs, $LiAlO_3$, $LiGaO_3$, ZnO, or a metal. In addition, the substrate has a crystallographic orientation along the C-plane, A-plane, M-plane or R-plane and has a mis-orientation ranging from 0.0° to 10° from its axis. The substrate preferably has a root mean square roughness ranging from 1 Å to 100 micron.

It will be apparent to those skilled in the art of ultraviolet light-emitting diodes and laser diodes that many modifications and substitutions can be made to the preferred embodiments described herein without departing from the spirit and scope of the present invention which is specifically set forth in the appended claims.

What is claimed is:

1. A light-emitting device comprising:
  a. an ultraviolet light-emitting structure having
    i. a first layer with a first conductivity, wherein said first layer comprises a first portion having a surface with an amount of elemental indium, said first portion surface being treated by a silicon containing precursor source and a second portion having a surface with an amount of elemental indium; said first layer comprises of plurality of said first portion and said second portion;
    ii. a second layer with a second conductivity; and
    iii. a light emitting quantum well region between above said first layer and second layer;
  b. a first electrical contact in electrical connection with said first layer;
  c. a second electrical contact in electrical connection with said second layer; and
  d. a template serving as a platform for said light-emitting structure; and
    whereby, when an electrical potential is applied to said first electrical contact and said second electrical contact said device emits ultraviolet light;
  and further comprising a layer between said first portion and said second portion of said first layer, said layer comprising an amount of elemental silicon and an amount of elemental indium.

2. The light-emitting device of claim 1, wherein said first portion has a thickness of between about 0.1 µm and about 7 µm.

3. The light-emitting device of claim 1, wherein said first portion surface includes holes.

4. The light-emitting device of claim 1, wherein said amount of elemental indium is a trace amount.

5. The light-emitting device of claim 4, wherein said trace amount of elemental indium is an amount of indium atoms ranging from about $10^{14}/cm^3$ to about $10^{24}/cm^3$.

6. The light-emitting device of claim 1, wherein said layer has a thickness about 500 Angstroms or less.

7. The light-emitting device of claim 1, wherein said template comprises
  a substrate;
  a low defect density first buffer layer comprising of $Al_{(1-m-n)}Ga_mIn_nN$ and said first buffer layer is treated with silicon and indium containing precursor source; and
  a second buffer layer comprising of $Al_{(1-m-n)}Ga_mIn_nN$ wherein said second buffer layer is doped with silicon and a trace amount of indium wherein $0 \leq m \leq 1$ and $0 \leq n < 1$ with 'm' increasing with distance from said substrate.

8. The light-emitting device of claim 7, wherein said first buffer layer comprises AlN with a trace amount of elemental indium.

9. The light-emitting device of claim 7, wherein said first buffer layer comprises a micro-undulated buffer layer comprising $Al_xIn_yGa_{1-x-y}N$, wherein $0 < x \leq 1$, $0 \leq y \leq 1$ and $0 < x+y \leq 1$.

10. The light-emitting device of claim 1 wherein said first layer is doped with silicon and may be co-doped with at least one material selected from indium, oxygen, and carbon.

11. The light-emitting device of claim 1 wherein said second layer comprises an hole tunneling layer, a grading layer and a contact layer.

12. The light-emitting device of claim 11, wherein said hole tunneling layer comprises $Al_xIn_yGa_{1-x-y}N$ with a trace amount of elemental indium, wherein $0 \leq x \leq 1$, $0 \leq y \leq 1$ and $0 \leq x+y \leq 1$.

13. The light-emitting device of claim 11, wherein said grading layer comprises $Al_xIn_yGa_{1-x-y}N$ with a trace amount of elemental indium, wherein $0 \leq x \leq 1$, $0 \leq y \leq 1$ and $0 \leq x+y \leq 1$.

14. The light-emitting device of claim 11, wherein said contact layer comprises GaN with a trace amount of elemental indium.

15. The light-emitting device of claim 11, wherein said second layer is doped with magnesium may be codoped with at least one material selected from indium, zinc and beryllium.

16. The light-emitting device of claim 1 wherein said template further comprises a substrate, a first buffer layer over said substrate and a second buffer layer over said first buffer layer.

17. The light-emitting device of claim 1—wherein said quantum well region comprises a quantum well layer of $Al_xIn_yGa_{1-x-y}N$ with or without an amount of elemental indium, wherein $0 \leq x \leq 1$, $0 \leq y \leq 1$, and $0 \leq x+y \leq 1$, said quantum well having a surface and a band gap.

18. The light-emitting device of claim 17 wherein said quantum well region further comprises a barrier layer on said surface of said quantum well, said barrier layer having a band gap larger than said band gap of said quantum well, and wherein said barrier layer includes $Al_xIn_yGa_{1-x-y}N$ wherein $0 < x \leq 1$, $0 \leq y \leq 1$ and $0 < x+y \leq 1$, and wherein said quantum well region begins and terminates with said barrier layer.

19. The light emitting device of claim 17 wherein said quantum well region comprises a single quantum well and multiple quantum well layers.

20. The light emitting device of claim 18 wherein said quantum well and said barrier layer have different Al and Ga compositions.

21. The light emitting device of claim 17 wherein said quantum well is doped with at least one n-type and at least one p-type dopant.

22. The light emitting device of claim 21 wherein said quantum well is doped with at least one n-type dopant selected from the group consisting of silicon, indium and carbon.

23. The light emitting device of claim 21 wherein said quantum well is doped with at least one p-type dopant selected from the group consisting of magnesium, zinc and beryllium.

24. The light emitting device of claim 21 wherein said quantum well region produces ultra-violet photons.

25. The light emitting device of claim 17 wherein said quantum well region emits with a wavelength λ in the range 190 nm≦λ≦240 nm.

26. The light emitting device of claim 17 wherein said quantum well region emits with a wavelength λ in the range 240 nm≦λ≦280 nm.

27. The light emitting device of claim 17 wherein said quantum well region emits with a wavelength λ in the range 280 nm≦λ≦320 nm.

28. The light emitting device of claim 17 wherein said quantum well region emits with a wavelength λ in the range 320 nm≦λ≦369 nm.

29. A light-emitting device comprising an ultraviolet light-emitting structure on a template wherein:
said ultraviolet light-emitting structure comprises:
  i. a first layer with a first conductivity, said first layer comprising a first portion having a surface and a second portion of $Al_xIn_yGa_{(1-x-y)}N$ with an amount of elemental indium, wherein $0 \leq x \leq 1$, $0 \leq y \leq 1$ and $0 \leq x+y \leq 1$, said first portion surface treated by a silicon containing precursor source and a second portion having a surface with an amount of elemental indium; said first layer comprises of plurality of said first portion and said second portion;
  ii. a second layer with a second conductivity, said second layer comprising $Al_xIn_yGa_{1-x-y}N$ with a trace amount of elemental indium, wherein $0 \leq x \leq 1$, $0 \leq y \leq 1$ and $0 \leq x+y \leq 1$; and
  iii. a light emitting quantum well region between said first layer and said second layer, said quantum well region comprising a quantum well layer of $Al_xIn_yGa_{1-x-y}N$ with a trace amount of elemental indium, wherein $0 \leq x \leq 1$, $0 \leq y \leq 1$ and $0 \leq x+y \leq 1$;
said template comprises:
  i. a substrate; and
  ii a low defect density first buffer layer comprising $Al_{(1-m-n)}Ga_mIn_nN$ and said first buffer layer is treated with a silicon and indium containing precursor source; a second buffer layer comprising of $Al_{(1-m-n)}Ga_mIn_nN$ wherein said second buffer layer is doped with silicon and a trace amount of indium; wherein $0 \leq m \leq 1$ and $0 \leq n < 1$ with 'm' increasing with distance from said substrate.

30. The light-emitting device of claim 29, wherein said first buffer layer comprises AlN with a trace amount of elemental indium.

31. The light-emitting device of claim 29, wherein said second buffer layer comprises $Al_{(1-m-n)}Ga_mIn_nN$ wherein said second buffer layer is doped with silicon and a trace amount of indium; wherein $0 \leq m \leq \alpha$ and $0 \leq n < 1$ with 'm' increasing with distance from said substrate.

32. The light-emitting device of claim 29 wherein said substrate has crystallographic orientation along one of c-plane, A plane, M plane, R plane or a semi-polar plane.

33. The light-emitting device of claim 29 wherein said substrate has a mis-orientation of less than 10° from its axis.

34. The light-emitting device of claim 29 wherein said substrate has a root mean square roughness of from about 1 Å to about 100 micron.

35. The light emitting device of claim 29 wherein said first layer is doped with silicon and at least one material selected from indium, oxygen and carbon.

36. The light-emitting device of claim 29 wherein said second layer is doped with at least one material selected from indium, magnesium, zinc and beryllium.

37. The light-emitting device of claim 29 further comprising layer between said first portion and said second portion, said layer comprising an amount of elemental silicon and an amount of elemental indium.

38. A method of making a light-emitting device, comprising the steps of:
forming a template by:
applying a first buffer layer to a substrate;
applying a second buffer layer over said first buffer layer;
forming an ultraviolet light-emitting structure, said forming step comprising the steps of:
  i. growing a first portion of a first layer, said first layer comprising $Al_xIn_yGa_{(1-x-y)}N$ with an amount of elemental indium, wherein $0 \leq x \leq 1$, $0 \leq y \leq 1$ and $0 \leq x+y \leq 1$;
  ii. treating the surface of said first portion with a silicon containing precursor source;
  iii. growing a second portion of said first layer, said first layer having a first conductivity; and
  iv. growing a second layer comprising $Al_xIn_yGa_{(1-x-y)}N$ with an amount of elemental indium, wherein $0 \leq x \leq 1$, $0 \leq y \leq 1$ and $0 \leq x+y \leq 1$, said second layer having a second conductivity;
placing said ultraviolet light-emitting structure on said template; and
connecting electrically a first electrical contact with said first layer of said ultraviolet light-emitting structure and a second electrical contact with said second layer of said ultraviolet light-emitting structure.

39. The method of making a light-emitting device of claim 38 wherein said first buffer layer comprises AlN.

40. The method of making a light-emitting device of claim 38 wherein said second buffer layer comprises $Al_{(1-m-n)}Ga_mIn_nN$ wherein said second buffer layer is doped with silicon and a trace amount of indium; wherein $0 \leq m \leq \alpha$ and $0 \leq n < 1$ with 'm' increasing with distance from said substrate.

41. The method of making a light-emitting device of claim 38 comprising the steps of growing said first layer and second layer by combination of one or more techniques such as pulse atomic layer epitaxy, metalorganic chemical vapor deposition method and hydride vapor phase epitaxy without removing the substrate from the reactor.

42. The method of making a light-emitting device of claim 38 comprising applying said first buffer layer and said second buffer layer by combination of one or more deposition techniques such as pulse atomic layer epitaxy, metalorganic chemical vapor deposition method and hydride vapor phase epitaxy without removing the substrate from the reactor.

43. The method of making a light-emitting device of claim 41 wherein said pulse method includes an alteration of the group V and group III reactant ratios.

44. The method of making a light-emitting device of claim 43 wherein said group V reactant is flowed at a constant rate and flow of said group III reactant is modulated.

45. The method of making a light-emitting device of claim 38 further comprising the step of forming at least one mesa prior to said connecting electrically step.

46. The method of making a light-emitting device of claim 38 further comprising separating said ultraviolet light-emitting structure from said template.

* * * * *

UNITED STATES PATENT AND TRADEMARK OFFICE
CERTIFICATE OF CORRECTION

| | |
|---|---|
| PATENT NO. | : 8,415,654 B2 |
| APPLICATION NO. | : 12/934650 |
| DATED | : April 9, 2013 |
| INVENTOR(S) | : Asif Khan et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 298 days.

Signed and Sealed this
Eleventh Day of June, 2013

Teresa Stanek Rea
*Acting Director of the United States Patent and Trademark Office*